United States Patent
Lanio et al.

(10) Patent No.: US 9,472,373 B1
(45) Date of Patent: Oct. 18, 2016

(54) BEAM SEPARATOR DEVICE, CHARGED PARTICLE BEAM DEVICE AND METHODS OF OPERATING THEREOF

(71) Applicant: ICT Integrated Circuit Testing Gesellschaft für Halbleiterprüftechnik mbH, Heimstetten (DE)

(72) Inventors: Stefan Lanio, Erding (DE); John Breuer, München (DE); Jürgen Frosien, Riemerling (DE); Matthias Firnkes, Walpertskirchen (DE); Johannes Hopster, Gauting (DE)

(73) Assignee: ICT INTEGRATED CIRCUIT TESTING GESELLSCHAFT FÜR HALBLEITERPRÜFTECHNIK MBH, Heimstetten (DE)

( * ) Notice: Subject to any disclaimer, the term of this patent is extended or adjusted under 35 U.S.C. 154(b) by 0 days.

(21) Appl. No.: 14/828,181

(22) Filed: Aug. 17, 2015

(51) Int. Cl.
*H01J 37/147* (2006.01)
*H01J 37/12* (2006.01)
(Continued)

(52) U.S. Cl.
CPC ............ *H01J 37/1472* (2013.01); *H01J 37/12* (2013.01); *H01J 37/153* (2013.01); *H01J 37/28* (2013.01); *H01J 2237/12* (2013.01); *H01J 2237/152* (2013.01); *H01J 2237/2538* (2013.01)

(58) Field of Classification Search
CPC ...... H01J 37/05; H01J 37/153; H01J 37/147; H01J 37/12; H01J 37/26; H01J 37/28; H01J 37/1472; H01J 2237/152; H01J 2237/12; H01J 2237/1534; H01J 2237/2538
See application file for complete search history.

(56) References Cited

U.S. PATENT DOCUMENTS

| 5,319,207 A | * | 6/1994 | Rose | ............... | H01J 37/153 |
| | | | | | 250/396 R |
| 5,449,914 A | * | 9/1995 | Rose | ............... | H01J 37/05 |
| | | | | | 250/305 |

(Continued)

OTHER PUBLICATIONS

Tromp, R., et al., "A new aberration-corrected, energy filtered LEEM?PEEM instrument. I. Principles and design," Ultramicroscopy 110 (2010) 852-861.*

(Continued)

*Primary Examiner* — Wyatt Stoffa
(74) *Attorney, Agent, or Firm* — Kilpatrick Townsend & Stockton LLP

(57) ABSTRACT

A beam separator device (200) is described. The beam separator device (200) includes a first deflector (112) providing a first magnetic deflection field ($B_1$) for deflecting a charged particle beam (101) propagating along a beam entrance axis (A1) by a first deflection angle ($\alpha 1$); a second deflector (114) arranged downstream from the first deflector (112) providing a second magnetic deflection field ($B_2$) for deflecting the charged particle beam by a second deflection angle ($\alpha 2$) in the direction of an intermediate beam axis (A2), wherein the second deflector (114) is configured for deflecting the charged particle beam (102) re-entering the beam separator device (200) along the intermediate beam axis (A2) by a third deflection angle ($\alpha 3$); a third deflector (212) arranged downstream from the second deflector (114) providing a third magnetic deflection field ($B_2$) for deflecting the charged particle beam (102) by a fourth deflection angle ($\alpha 4$) in the direction of a beam exit axis (A3); a first rotation-free lens to be arranged at a first crossover (X1) of the charged particle beam between the first deflector (112) and the second deflector (114) for at least partially compensating for a dispersion introduced by at least one of the first deflector and the second deflector; and a second rotation-free lens to be arranged at a second crossover (X2) of the charged particle beam between the second deflector (114) and the third deflector (212) for at least partially compensating for a dispersion introduced by at least one of the second deflector and the third deflector.

20 Claims, 6 Drawing Sheets

(51) Int. Cl.
*H01J 37/28* (2006.01)
*H01J 37/153* (2006.01)

(56) References Cited

U.S. PATENT DOCUMENTS

| | | | | |
|---|---|---|---|---|
| 6,150,657 | A * | 11/2000 | Kimoto | H01J 37/05 250/305 |
| 6,384,412 | B1 * | 5/2002 | Krahl | H01J 37/05 250/305 |
| 6,803,571 | B1 * | 10/2004 | Mankos | G01N 23/225 250/305 |
| 7,022,987 | B2 * | 4/2006 | Preikszas | H01J 37/147 250/310 |
| 7,348,566 | B2 * | 3/2008 | Tromp | H01J 37/05 250/305 |
| 7,453,062 | B2 * | 11/2008 | Tromp | H01J 37/05 250/305 |
| 8,274,046 | B1 | 9/2012 | Ren et al. | |
| 8,334,508 | B1 * | 12/2012 | Mankos | H01J 37/05 250/305 |
| 8,592,776 | B2 * | 11/2013 | Enyama | H01J 37/1472 250/306 |
| 8,729,466 | B1 * | 5/2014 | Mankos | H01J 37/026 250/305 |
| 2002/0070340 | A1 * | 6/2002 | Veneklasen | H01J 37/256 250/310 |
| 2004/0036031 | A1 * | 2/2004 | Rose | H01J 37/153 250/396 R |
| 2004/0108457 | A1 * | 6/2004 | Kienzle | H01J 37/05 250/310 |
| 2010/0065753 | A1 * | 3/2010 | Enyama | H01J 37/1472 250/397 |
| 2010/0096550 | A1 * | 4/2010 | Yamazaki | G01N 23/2251 250/310 |

OTHER PUBLICATIONS

Muller, H., et al., "A Beam Separator with small aberrations" Journal of Electron Microscopy 48(3): 191-204 (1999).*
Notice of Allowance of Jan. 22, 2016 for U.S. Appl. No. 14/828,352, 8 pages.

* cited by examiner

BEAM SEPARATOR DEVICE, CHARGED PARTICLE BEAM DEVICE AND METHODS OF OPERATING THEREOF

TECHNICAL FIELD

Embodiments of the present invention relate to a charged particle beam device, for example, for inspection system applications, testing system applications, defect review or critical dimensioning applications, surface imaging applications (SEM) or the like, to a beam separator device to be used in a charged particle beam device, and to methods of operating thereof. Embodiments of the present invention particularly relate to a beam separator device for separating a charged particle beam, e.g. an electron beam, deflected toward a reflector device from the back-reflected charged particle beam, as well as to a charged particle beam device with a beam separator device for providing an aberration-corrected charged particle beam. Further embodiments relate to methods of operating a charged particle beam device, in particular for providing an aberration corrected charged particle beam.

BACKGROUND

Semiconductor technologies have created a high demand for structuring and probing specimen in the nanometer or even in the sub-nanometer scale. Micrometer and nanometer scale process control, inspection or structuring, is often done with charged particle beams, e.g. electron beams, which are generated, deflected and focused in charged particle beam devices, such as electron microscopes or electron beam pattern generators. For inspection purposes, charged particle beams offer superior spatial resolution compared to, e.g. photon beams because their wavelengths are shorter than the wavelengths of light beams.

Inspection devices using charged particle beams such as scanning electron microscopes (SEM) have many functions in a plurality of industrial fields, including, but not limited to, inspection of electronic circuits during manufacturing, exposure systems for lithography, detecting devices, defect inspection tools, and testing systems for integrated circuits. In such particle beam systems, fine probes with high current density can be used. For instance in case of an SEM, the primary electron (PE) beam generates particles like secondary electrons (SE) and/or backscattered electrons (BSE) that can be used to image and analyze a specimen.

For high resolution imaging devices based on electron optics systems reduced aberrations and/or an improved aberration correction is one aspect to be considered. The provision of charged particle beam devices having aberration correction is beneficial. In particular, beam shaping and beam steering elements in the beam propagation path, e.g. beam deflectors, beam separators etc., may cause additional aberrations or dispersion which should be reduced or corrected in order to be able to provide for an inspection device with a high spatial resolution in the sub-nanometer range.

SEM columns are limited in their achievable resolution due to the diffraction limit, chromatic and/or spherical aberrations of the objective lens and/or other optical components included in the SEM column. In particular at low landing energies of 5 keV or below, in particular 500 eV or below, chromatic aberration is the limitation. Further, spatial dispersion of charged particles within the energy width of the charged particle beam as well as spherical aberrations may prevent a significant improvement of resolution.

SUMMARY

In light of the above, according to the independent claims, a beam separator device and a charged particle beam device including a beam separator device are provided. Further, methods of aligning a beam separator device and a charged particle beam device for providing an aberration corrected charged particle beam are provided. Further aspects, advantages, and features of the present invention are apparent from the dependent claims, the description, and the accompanying drawings.

According to embodiments described herein, a beam separator device is provided, including: a first deflector providing a first magnetic deflection field for deflecting a charged particle beam propagating along a beam entrance axis by a first deflection angle; a second deflector arranged downstream from the first deflector providing a second magnetic deflection field for deflecting the charged particle beam by a second deflection angle in the direction of an intermediate beam axis, wherein the second deflector is configured for deflecting the charged particle beam re-entering the beam separator device along the intermediate beam axis by a third deflection angle; a third deflector arranged downstream from the second deflector providing a third magnetic deflection field for deflecting the charged particle beam by a fourth deflection angle in the direction of a beam exit axis; a first rotation-free lens, particularly a first electrostatic lens, to be arranged at a first crossover of the charged particle beam between the first deflector and the second deflector for at least partially compensating for a dispersion introduced by at least one of the first deflector and the second deflector; and a second rotation-free lens, particularly a second electrostatic lens, to be arranged at a second crossover of the charged particle beam between the second deflector and the third deflector for at least partially compensating for a dispersion introduced by at least one of the second deflector and the third deflector.

According to a further aspect, a charged particle beam device is provided. The charged particle beam device comprises a beam source for generating a charged particle beam; a lens device; and a beam separator device located downstream from the lens device. The beam separator device includes: a first deflector providing a first magnetic deflection field for deflecting the charged particle beam by a first deflection angle; a second deflector arranged downstream from the first deflector providing a second magnetic deflection field for deflecting the charged particle beam by a second deflection angle in the direction of an intermediate beam axis, wherein the second deflector is configured for deflecting the charged particle beam re-entering the beam separator device along the intermediate beam axis by a third deflection angle; a third deflector arranged downstream from the second deflector providing a third magnetic deflection field for deflecting the charged particle beam by a fourth deflection angle; a first rotation-free lens, particularly a first electrostatic lens, to be arranged at a first crossover of the charged particle beam between the first deflector and the second deflector for at least partially compensating for a dispersion introduced by at least one of the first deflector and the second deflector; and a second rotation-free lens, particularly a second electrostatic lens, to be arranged at a second crossover of the charged particle beam between the second deflector and the third deflector for at least partially compensating for a dispersion introduced by at least one of the second deflector and the third deflector. The lens device and the first deflector are configured to generate the first crossover of the charged particle beam at the position of the first rotation-free lens.

According to a further aspect, a method of aligning a beam separator device is provided. The method includes: generating a charged particle beam; deflecting the charged particle beam with a first magnetic deflection field by a first deflection angle; deflecting the charged particle beam with a second magnetic deflection field by a second deflection angle; exciting a reflector device for back-reflecting the charged particle beam toward the second magnetic deflection field, wherein the second magnetic deflection field deflects the reflected charged particle beam by a third deflection angle; deflecting the charged particle beam with a third magnetic deflection field by a fourth deflection angle; exciting at least one of a first rotation-free lens, particularly a first electrostatic lens, arranged at a position of a first crossover of the charged particle beam between the first magnetic deflection field and the second magnetic deflection field and a second rotation-free lens, particularly a second electrostatic lens, arranged at a position of a second crossover of the charged particle beam between the second magnetic deflection field and the third magnetic deflection field to at least partially compensate for a dispersion of the charged particle beam.

Embodiments are also directed at apparatuses for carrying out the disclosed methods and include apparatus parts for performing the individual method actions. This method may be performed by way of hardware components, a computer programmed by appropriate software, by any combination of the two or in any other manner. Furthermore, embodiments according to the invention are also directed at methods of operating the described apparatus.

Further advantages, features, aspects and details that can be combined with embodiments described herein are evident from the dependent claims, the description and the drawings.

BRIEF DESCRIPTION OF THE DRAWINGS

So that the manner in which the above recited features of the present invention can be understood in detail, a more particular description of the invention, briefly summarized above, may be had by reference to embodiments.

The accompanying drawings relate to embodiments of the invention and are described in the following.

DETAILED DESCRIPTION OF EMBODIMENTS

Figure 1A:
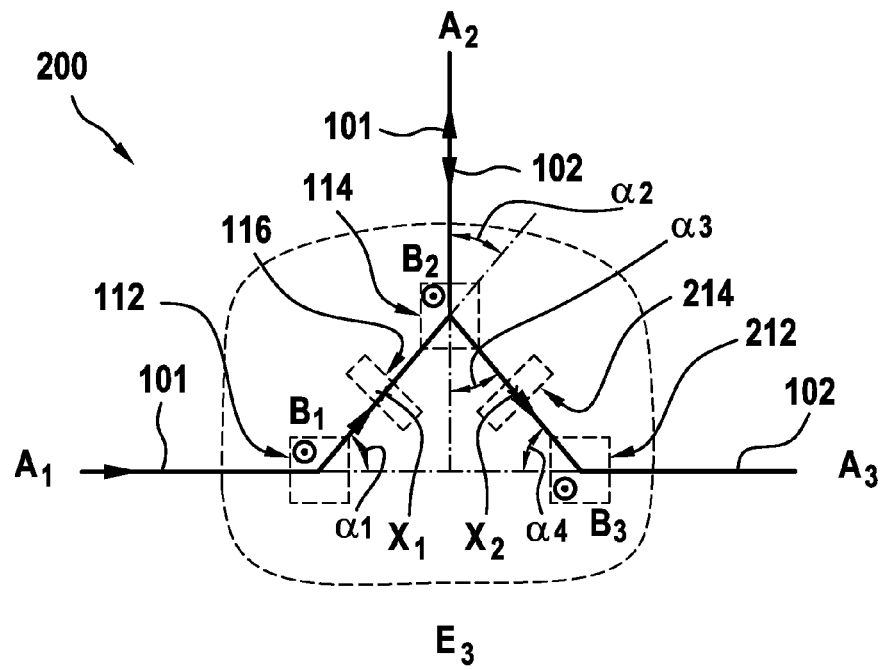
FIG. 1A shows a beam separator device according to embodiments described herein in a schematic view.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Embodiments described herein relate to a beam separator device to be utilized in a charged particle beam device, for example, for inspection system applications, testing system applications, defect review or critical dimensioning applications or surface imaging applications (SEM). The charged particle beam device may include a beam source adapted for generating a charged particle beam, e.g. an electron beam, and a lens device for shaping the generated charged particle beam so that the charged particle beam propagates along an optical axis. The lens device may be a condenser lens system (CLS) adapted for collimating or focusing the charged particle beam with a predetermined beam width and beam convergence. The beam source can be designed as a high brightness, low energy width beam source selected from the group consisting of a thermal field emitter (TFE) source, a cold field emitter (CFE) source, or carbon nanotube source. By operating the beam source in combination with the lens device, a charged particle beam, e.g. a beam of primary electrons PE can be emitted and directed toward further beam optics, e.g. toward a beam separator device, along a beam entrance axis A1.

Before a charged particle beam is directed to a specimen to be inspected or processed, e.g. a semiconductor wafer, a mask, a workpiece etc., the charged particle beam may pass through one or more (electron-)optical elements arranged along a charged particle beam propagation path. According to embodiments described herein, the charged particle beam may be deflected toward a beam reflector including a mirror corrector configured for compensating spherical and/or chromatic aberrations, and the back-reflected compensated charged particle beam may then again be deflected toward an objective lens system. The objective lens system may be adapted for focusing the compensated charged particle beam onto the specimen, where signal particles, such as signal electrons, may originate from interaction with the specimen. The signal electrons may then be deflected towards a detector assembly.

It may be necessary to separate the back-reflected compensated charged particle beam from the charged particle beam propagating toward the mirror corrector. For this purpose, a beam separator device according to embodiments described herein may be used. The beam separator device may include a first deflector part for deflecting the charged particle beam entering the beam separator device along a beam entrance axis A1 toward the reflector device in the direction of an intermediate beam axis A2, and it may include a second deflector part for deflecting the back-reflected charged particle beam propagating back toward the beam separator device along the intermediate beam axis A2 in the direction of a beam exit axis A3, in order to separate the back-reflected charged particle beam from the entering charged particle beam.

Beam separator devices as described above, e.g. beam separator devices to be used in scanning electron microscopes, may therefore comprise one or more deflector parts for deflecting the charged particle beam by a deflection angle with respect to a beam entrance axis. Typically, deflector parts may include magnetic and/or electrostatic deflection fields which allow a substantial change of direction of the optical axis with respect to a direction of incidence. The deflection angle may be understood as the angle between the optical axis upstream from the deflector part and the optical axis downstream from the deflector part. For example, a deflector part may deflect the charged particle beam by a deflection angle between 70° and 110°, as opposed to deflection fields which are used for aligning an electron optical column with a substantially straight optical axis, where the direction of the optical axis is only changed by a few degrees or even only a few mrad.

A beam separator device may have the effect of two deflector parts successively arranged along the charged particle beam propagation path. During a first pass through the beam separator device, wherein the charged particle beam propagates through the first deflector part, the charged particle beam may be deflected by a deflection angle, e.g. a deflection angle between 20° and 110°. During a second pass through the beam separator device, wherein the charged particle beam propagates through the second deflector part, the charged particle beam may be deflected by another deflection angle, e.g. a deflection angle between 20° and 110°. A beam exit of the first deflector part may correspond to a beam entrance of the second deflector part. In a straight vision system, a beam separator device may be configured to deflect an incoming charged particle beam propagating along a beam entrance axis by a first deflection angle to direct the charged particle beam in the direction of an intermediate beam axis on the first pass, and to deflect the charged particle beam re-entering the beam separator device along the intermediate beam axis to further propagate along the beam entrance axis after the second pass. In this case, the total deflection angle of the beam separator device may be 0° so that a straight vision system may be provided.

Whereas deflection fields usable for beam alignment or to compensate for mechanical alignment errors may affect the beam quality in a less significant way, beam deflectors with deflection angles of more than 20°, in particular beam deflectors with deflection angles of more than 70°, may introduce more significant distortions. For example, a magnetic deflector may have a focusing effect on a charged particle beam in only one plane, which may cause an astigmatism of the charged particle beam. Further, the deflection angle of a magnetic deflector may be dependent on particle energy, which may cause a spatial dispersion of the charged particle beam. Beam deflectors providing beam deflection angles of more than 20° may also be referred to as beam benders.

The resolution attainable in a charged particle beam device may therefore be negatively affected by beam distortions caused by beam separator devices arranged in the charged beam propagation path. According to embodiments described herein, the resolution limit may be improved by providing a beam separator device which does not cause substantial beam aberrations or distortions. In particular, beam separator devices deflecting, during each pass, a charged particle beam by large deflection angles, e.g. 90°, which do not introduce substantial spatial dispersion into the optical system or that are even non-dispersive are provided. "Dispersion", as used herein, may mean a spatial dispersion of the charged particle beam, i.e. a deviation of charged particles from the optical axis depending on the particle energy. When the divergence angle of the charged particles of the charged particle beam depends on the particle energy, the resulting spatial dispersion may also be referred to as "angular" dispersion.

A beam separator device 200 according to embodiments described herein including two successive deflector parts, wherein each deflector part may deflect the charged particle beam by a deflection angle of more than 20°, is schematically shown in FIG. 1A. The beam separator device 200 includes a first deflector 112 providing a first magnetic deflection field $B_1$, e.g. a magnetic dipole field, for deflecting the charged particle beam 101 propagating along a beam entrance axis A1 by a first deflection angle; a second deflector 114 arranged downstream from the first deflector 112 providing a second magnetic deflection field $B_2$, e.g. a magnetic dipole field, for deflecting the charged particle beam 101 by a second deflection angle toward an intermediate beam axis A2, wherein the second deflector 114 is configured for deflecting the charged particle beam re-entering the beam separator device along the intermediate beam axis A2 (hereinafter referred to as reflected charged particle beam 102) by a third deflection angle; and a third deflector 212 arranged downstream from the second deflector 114 providing a third magnetic deflection field $B_3$ for deflecting the charged particle beam by a fourth deflection angle to direct the charged particle beam along a beam exit axis A3.

The beam separator device 200 further includes a first rotation-free lens, particularly a first electrostatic lens 116, to be arranged at a first crossover X1 of the charged particle beam between the first deflector 112 and the second deflector 114 for at least partially compensating for a dispersion introduced by at least one of the first deflector and the second deflector, and a second rotation-free lens, particularly a second electrostatic lens 214, to be arranged at a second crossover X2 of the charged particle beam between the second deflector 114 and the third deflector 212 for at least partially compensating for a dispersion introduced by at least one of the second deflector and the third deflector. In some embodiments, the first electrostatic lens 116 and the second electrostatic lens 214 may be a single electrostatic lens, respectively.

A rotation-free lens, e.g. an electrostatic lens, does not rotate the charged particle beam around the optical axis. On the other hand, a single magnetic lens would rotate the dispersion plane. However, also a rotation-free double-magnetic lens or other rotation-free lens devices may be used as the rotation-free lens in accordance with embodiments described herein.

At the position of a "crossover of a charged particle beam" as used herein, an image of the beam source may be formed. In other words, the first electrostatic lens and the second electrostatic lens may each be arranged in an image plane of the charged particle beam, where a real space image of the beam source is generated. For example, the beam source may be a thermal field emitter TFE source, a cold field emitter CFE source, a single atom tip or a carbon nanotube source, the image of which is formed at the position of the first and second crossovers. The beam source may exhibit a virtual source size smaller than 500 nm ("point source"), particularly smaller than 300 nm, and/or may provide a charged particle beam with a reduced brightness larger than $10^7$ A/(m²srV).

In some implementations, the first electrostatic lens 116 and the first crossover X1 of the charged particle beam may be arranged at a center position between the first deflector and the second deflector. In other words, a length of a first part of the charged particle beam propagation path between the first deflector and the first electrostatic lens may correspond to a length of a second part of the charged particle beam propagation path between the first electrostatic lens and the second deflector. In some embodiments, which may be combined with other embodiments described herein, the second electrostatic lens 214 and the second crossover X2 of the charged particle beam may be arranged at a center position between the second deflector and the third deflector. In other words, a length of a third part of the charged particle beam propagation path between the second deflector and the second electrostatic lens may correspond to a length of a fourth part of the charged particle beam propagation path between the second electrostatic lens and the third deflector.

According to some embodiments, which may be combined with other embodiments described herein, the first deflector and the second deflector may be arranged and/or may be configured symmetrically with respect to a first symmetry plane E1 which intersects through the first electrostatic lens 116. The first symmetry plane E1 may intersect the center position between the first deflector and the second deflector perpendicular to the charged particle beam propagation path. A "symmetric" configuration of the first deflector and the second deflector as used herein may mean that the first magnetic deflection field of the first deflector experienced by or acting upon the charged particle beam may be essentially symmetrical to the second magnetic deflection field of the second deflector experienced by or acting upon the charged particle beam on the first pass through the beam separator device.

According to some embodiments, which may be combined with other embodiments described herein, the second deflector and the third deflector may be arranged and/or may be configured symmetrically with respect to a second symmetry plane E2 which intersects through the second electrostatic lens 214. The second symmetry plane E2 may intersect the center position between the second deflector and the third deflector perpendicular to the charged particle beam propagation path. A "symmetric" configuration of the second deflector and the third deflector as used herein may mean that the second magnetic deflection field of the second deflector experienced by or acting upon the charged particle beam may be essentially symmetrical to the third magnetic deflection field of the third deflector experienced by or acting upon the charged particle beam on the second pass through the beam separator device.

As is shown in FIG. 1A, during the first pass through the beam separator device 200, the charged particle beam 101 may be deflected by a deflection angle of 90° from the beam entrance axis A1 toward the intermediate beam axis A2. During the second pass through the beam separator device 200, the reflected charged particle beam 102 may be deflected by another deflection angle of 90° from the intermediate beam axis A2 toward the beam exit axis A3, which may correspond to the beam entrance axis A1. In this case, the first deflection angle, the second deflection angle, the third deflection angle, and the fourth deflection angle may be 45°.

In some embodiments, the first deflection angle and the second deflection angle are identical, and the third deflection angle and the fourth deflection angle are identical. Particularly, all four deflection angles are identical. Further, in some embodiments, which may be combined with other embodiments described herein, all four deflection angles may be angles between 10° and 60°.

The setup of the beam separator device 200 may be symmetrical with respect to a third symmetry axis E3 which extends along the intermediate beam axis A2 and perpendicular to the plane of deflection. In the following description, a first deflector part 110 of the beam separator device 200 (which acts upon the charged particle beam 101 during the first pass through the beam separator device 200) will be described in detail. The first deflector part 110 has the effect of a beam deflector for deflecting the charged particle beam 101 propagating along the beam entrance axis A1 toward the intermediate beam axis A2. The general setup of a second deflector part 210 of the beam separator device 200 (which acts upon the reflected charged particle beam 102 during the second pass through the beam separator device 200), may correspond to the general setup of the first deflector part 110, and will only be briefly explained afterwards. The second deflector part 210 may have the effect of a beam deflector for deflecting the charged particle beam incident along the intermediate beam axis A2 in the direction of the beam exit axis A3.

Figure 1B:
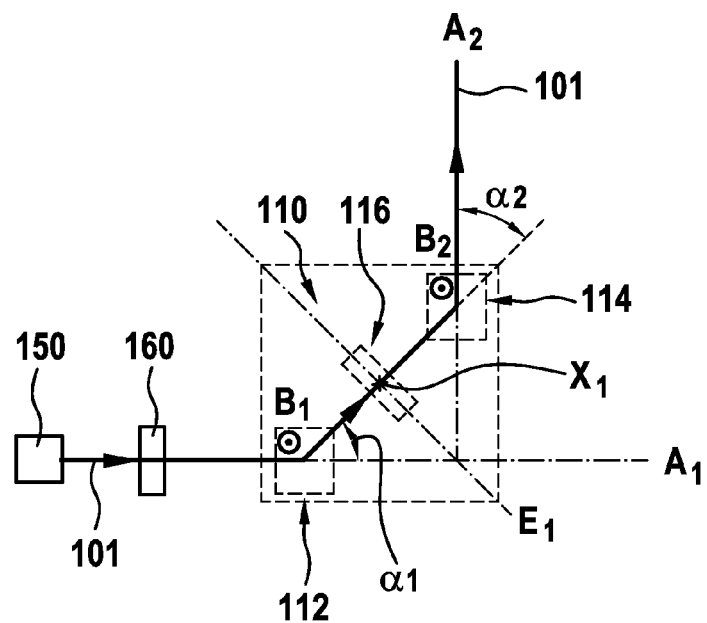
FIG. 1B shows a first deflector part of the beam separator device of FIG. 1A in a schematic view.

The first deflector part 110 is shown in FIG. 1B in a schematic view and includes the first deflector 112 providing the first magnetic deflection field, e.g. a magnetic dipole field, for deflecting the charged particle beam by a first deflection angle $\alpha 1$, the second deflector 114 providing the second magnetic deflection field, e.g. a magnetic dipole field, for deflecting the charged particle beam by a second deflection angle $\alpha 2$, and the electrostatic lens 116 arranged between the first deflector and the second deflector for at least partially compensating for a dispersion introduced by at least one of the first deflector and the second deflector. A beam source 150 for generating the charged particle beam and a lens device 160 may be arranged upstream from the first deflector part 110, wherein the lens device 160 in combination with the first deflector 112 may be configured for generating the first crossover X1 of the charged particle beam 101 at the position of the first electrostatic lens 116.

According to some embodiments, the first deflection angle may correspond to the second deflection angle. The charged particle beam 101 may be focused by the lens device 160, which may be arranged upstream from the first deflector 112, in such a way that the first crossover X1 is located downstream from the first deflector 112. The magnetic deflection field of the first deflector may deflect the charged particle beam 101 by 45° (e.g. counterclockwise) with respect to the beam entrance axis A1, and the magnetic deflection field of the second deflector 114 arranged downstream from the first crossover X1 may deflect the charged particle beam by another 45° (e.g. counterclockwise). In other embodiments, the total deflection angle of the first deflector part 110 may be different, e.g. an angle between 20° and 110°, particularly an angle between 70° and 95°. In some embodiments, both deflections may be clockwise.

In some embodiments described herein, a first cross-sectional beam profile upstream from the first deflector part 110 may correspond to a second cross-sectional beam profile downstream from the first deflector part 110. Particularly, both the first cross-sectional beam profile and the second cross-sectional beam profile may be round or circular.

Magnetic sector deflectors with a first deflector 112 for deflecting the charged particle beam by a first deflection angle and a spaced-apart second deflector 114 for deflecting the charged particle beam by a second deflection angle, with a crossover arranged between the first deflector and the second deflector may provide several advantages: First, as the first deflector and the second deflector are arranged and configured symmetrically with respect to the first crossover X1 of the charged particle beam, a deflection deviation of the first deflector on a given paraxial ray may be inverse to a deflection deviation of the second deflector on the paraxial ray, so that the general beam shape may be kept constant. Second, stigmatic deflection may be achieved, as will be described below in further detail. Third, because the first crossover X1 is located at the position of the first electrostatic lens, the shape of the charged particle beam is unaffected by the electrostatic lens. Therefore, the charged particle beam may symmetrically pass through the second deflector after having passed through the electrostatic lens, and may exit the first deflector part 110 with a cross-sectional shape corresponding to the original cross-sectional shape, particularly as a round beam bundle. On the other hand, the first electrostatic lens may focus charged particles with an energy deviating from a nominal beam energy in such a way that during the pass of the second half of the first deflector part accumulated dispersion from the first half of the first deflector part can be cancelled.

Figure 2:
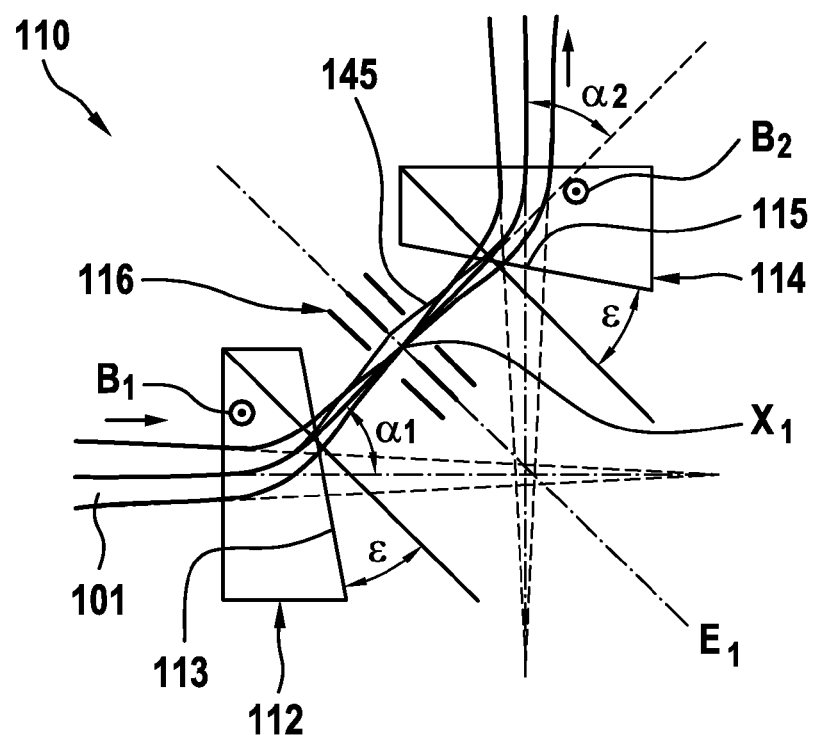
FIG. 2 shows a first deflector part of a beam separator device according to embodiments described herein.

For example, charged particles with a particle energy smaller than a nominal particle energy of the charged particle beam ("low-energy particles 145") may be deflected by the first deflector 112 by an angle larger than the first deflection angle α1. This may lead to an off-axis propagation of the deflected low-energy particles 145, as is schematically shown in FIG. 2. In particular, the low-energy particles do not propagate through the first crossover X1 located at the position of the first electrostatic lens 116 and are, therefore, steered back towards the optical axis by the first electrostatic lens. As the first electrostatic lens 116 may be arranged centrally between the first deflector and the second deflector, and as the first magnetic deflection field $B_1$ of the first deflector and the second magnetic deflection field $B_2$ of the second deflector may be arranged and configured in a symmetric way, spatial dispersion of the low-energy particles 145 may be substantially or completely cancelled after propagation through the second deflector. The same is true for high-energy particles.

The orientation of the first magnetic deflection field $B_1$ with respect to the optical axis may correspond to the orientation of the second magnetic deflection field $B_2$ with respect to the optical axis. A corresponding orientation may lead to two successive deflections within one deflection plane in the same deflection direction (two clockwise deflections or two counterclockwise deflections).

A symmetric setup of the first deflector part may lead to (i) a charged particle beam propagation path which is symmetrical with respect to the first symmetry plane E1 within the first deflector part 110, (ii) a cross sectional profile of the charged particle beam which is symmetrical with respect to the first symmetry plane E1 in every sectional plane perpendicular to the charged particle beam propagation path within the first deflector part 110, and/or (iii) to a cross sectional energy distribution of the charged particle beam which is symmetrical with respect to the first symmetry plane E1 in every sectional plane perpendicular to the charged particle beam propagation path within the first deflector part 110.

FIG. 2 shows the first deflector part 110 of a beam separator device 200 according to embodiments described herein. Similar to the arrangement shown in FIG. 1B, the first deflector part 110 includes the first deflector 112 configured for deflecting the charged particle beam by a first deflection angle α1, and the second deflector 114 configured for deflecting the charged particle beam by the second deflection angle α2.

A magnetic deflection field may be generated by a magnetically excited pole-piece pair (also referred to as a "prism", as it deflects an incoming beam by a predetermined angle), which may be arranged symmetrically on both sides of a mid-plane that contains the curved charged particle beam propagation path. The plane, in which deflection occurs, may be referred to as the deflection plane or plane of deflection, and the plane along the beam propagation path perpendicular to the deflection plane may be referred to as the off-plane. The magnetically excited pole pieces may have a predetermined shape in a plan view as shown in FIG. 2, which may define the edges of a deflection space between the pole piece pair. For example, the shape of the pole pieces in a plan view may be at least partially polygonal, e.g. rectangular, or at least partially rounded, e.g. oval. In embodiments, which may be combined with other embodiments described herein, the shape of the pole pieces in a plan view is trapezoidal. In particular, a beam entrance edge and/or a beam exit edge of the deflector may be straight, curved or inclined.

Such beam deflectors are based on the fact that charged particles travelling in a magnetic field are acted upon by a force in a direction perpendicular to both the direction of travel and the direction of the magnetic field. Magnetic beam deflectors may have a focusing effect on the charged particle beam at least in the deflection plane, but typically not equally in the off-plane, so that they may not focus stigmatically. Stigmatic focusing is characterized by the same beam crossover position in the deflection plane and in the off-plane.

The first deflector part 110 shown in FIG. 2 may provide for a single position of the first crossover X1 in the deflection plane and in the off-plane, and may at the same time reduce or remove a spatial dispersion caused by the first deflector and the second deflector, because the first electrostatic lens 116 is arranged at the position of the first crossover X1.

According to some embodiments described herein, at least one of the beam entrance edge and the beam exit edge of the first deflector 112 may be shaped for reducing an astigmatism caused by the first deflector part 110. For example, with the use of curved or inclined edges of the pole pieces of the first deflector, magnetic fringe fields may be generated at the beam entrance and/or at the beam exit for providing a focusing action also in the off-plane. These generated fringe fields between the tilted pole-piece edges may act as magnetic multipole components, e.g. as magnetic quadrupole components.

According to the embodiment shown in FIG. 2, the beam exit edge 113 of the first deflector is tilted by a tilting angle ε with respect to a sectional plane perpendicularly intersecting the charged particle beam propagation path downstream from the first deflector 112 and upstream from the second deflector 114. In other words, the edges of the pole pieces of the first deflector facing towards first electrostatic lens 116 may be tilted with respect to the first symmetry plane E1 by the tilting angle ε at least in an area which is traversed by the charged particle beam. The tilting angle of the beam exit edge 113 of the first deflector may introduce a quadrupole field that, together with the deflecting magnetic (dipole) field may move the first crossover X1 of the charged particle beam into the first symmetry plane E1, where the first electrostatic lens 116 is positioned.

In some embodiments, the beam exit edge 113 may also be tilted with respect to a second sectional plane perpendicularly intersecting the charged particle beam propagation path upstream from the first deflector, particularly by a tilting angle of (α1-ε). In other words, the beam exit edge 113 may be inclined with respect to the second sectional plane upstream from the first deflector, but with a smaller inclination angle than the first sectional plane downstream from the first deflector. For example, in case of a counter-clockwise deflection of the charged particle beam by the first deflector 112 (see FIG. 2), the beam exit edge 113 may be tilted counterclockwise with respect to the second sectional plane and clockwise with respect to the first symmetry plane E1, and vice versa.

Without an inclination of the beam exit edge 113 of the first deflector, the charged particle beam would be astigmatic, and it would not be possible to provide a focus of both the deflection-plane rays and the off-plane rays in the same focal point.

According to embodiments described herein, the tilting angle ε is larger than 1° and smaller than 80°, particularly larger than 5° and smaller than 45°. The exact value of the tilting angle may depend on the first deflection angle α1, on the beam properties of the incident beam and on the position of the first crossover X1 (i.e. the first symmetry plane), and for a first deflection angle of 45° the tilting angle may be about 35°.

In order to provide for a symmetric setup of the first deflector part 110, also a beam entrance edge 115 of the second deflector 114 may be tilted by the tilting angle ε with respect to a sectional plane perpendicularly intersecting the charged particle beam propagation path downstream from the first deflector and upstream from the second deflector. In other words, the edges of the pole pieces of the second deflector 114 facing towards the first electrostatic lens 116 may be tilted with respect to the first symmetry plane E1 by the tilting angle ε, at least in an area which is traversed by the charged particle beam during the first pass through the beam separator device. Thus, the beam exit edge 113 of the first deflector and the beam entrance edge 115 of the second deflector are symmetrical with respect to the first symmetry plane E1. A symmetrically configured quadrupole field component may be introduced by the tilted beam entrance edge 115 of the second deflector, so that an original cross-sectional shape of the charged particle beam may be restored while passing through the second deflector toward the intermediate beam axis A2.

According to some embodiments described herein, the beam entrance edge of the first deflector may be perpendicular to the beam entrance axis A1, and the beam exit edge of the second deflector may be perpendicular to the intermediate beam axis A2, so that the shape of a deflection space of the first deflector traversed by the charged particle beam is a mirror image of the shape of a deflection space of the second deflector traversed by the charged particle beam during the first pass through the beam separator device.

Alternatively or additionally, an astigmatism reduction device such as a multipole element (electric or magnetic) providing an additional magnetic field for reducing an astigmatism of the first crossover X1 may be provided. In some embodiments, the astigmatism reduction device may be arranged between the first deflector and the first electrostatic lens. In order to provide for a symmetric setup, a corresponding multipole element may also be provided between the first electrostatic lens and the second deflector. However, an additional astigmatism reduction device may not be necessary, and a stigmatic charged particle beam may already be provided by the shape of the magnetic dipole fields of the first and second deflectors.

The first crossover X1 being located centrally between the first deflector and the second deflector, where the first electrostatic lens 116 is arranged, the particles of the charged particle beam with nominal energy are unaffected by the first electrostatic lens 116. The charged particle beam 101 symmetrically passes through the second deflector 114, is deflected by the second deflection angle, and exits the first deflector part 110 with an original cross-sectional shape, e.g. as a round bundle. However, the first electrostatic lens 116 focuses high- and low-energy particles in such a way that the spatial dispersion is reduced or cancelled during the passing of the second deflector 114

As is shown in FIG. 2, the charged particle beam 101 may enter the first deflector part 110 converging slightly. The beam convergence may be provided by the lens device 160 arranged upstream from the first deflector. In some embodiments, the charged particle beam may enter the first deflector part 110 as a collimated charged particle beam or as a divergent charged particle beam. In this case, the focusing effect may be provided by the first deflector 112 alone. Both the lens device 160 arranged upstream from the first deflector 112 and the first deflector 112 may have a focusing effect on the charged particle beam 101, and the lens device 160 and the first deflector 112 may be configured such that, in combination, the focusing effects create the first crossover X1 of the charged particle beam 101 at a center position between the first deflector and the second deflector, where the electrostatic lens is arranged.

When operating the first deflector part 110 shown in FIG. 2, the charged particle beam may first be aligned to pass stigmatically through the first deflector and the second deflector by adjusting the properties of the first magnetic deflection field and the second magnetic deflection field as well as the parameters of the charged particle beam entering the first deflector part 110, e.g. adjusting the position of the first crossover X1. Afterwards, the dispersion can be reduced or cancelled by exciting the first electrostatic lens 116.

A method of aligning the first deflector part 110 may comprise: focusing the charged particle beam to generate a first crossover X1 at a first distance of the first deflector 112, wherein the first magnetic deflection field of the first deflector is switched off so that the charged particle beam passes through the first deflector without being deflected; switching on the first magnetic deflection field to deflect the charged particle beam by the first deflection angle α1 and to shift the first crossover to a second distance of the first magnetic deflection field, where the first electrostatic lens 116 is arranged; exciting a second magnetic deflection field to deflect the charged particle beam by the second deflection angle α2; and exciting the first electrostatic lens arranged at the position of the first crossover to at least partially compensate for a dispersion of the charged particle beam.

Figure 3:
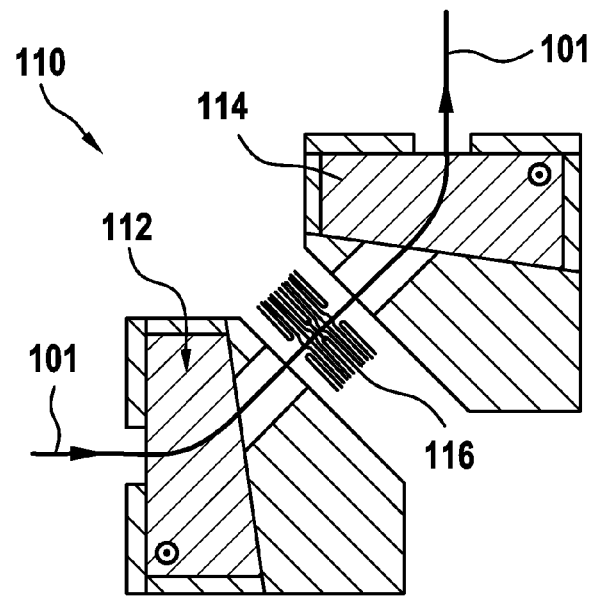
FIG. 3 shows a first deflector part of a beam separator device according to embodiments described herein.

FIG. 3 shows the first deflector part 110 of a beam separator device 200 according to embodiments described herein. The first deflector part 110 includes a first deflector 112 and a second deflector 114, each deflector including essentially trapezoidal pole piece pairs for providing the respective magnetic deflection fields. The first electrostatic lens 116 is arranged in the middle between the first deflector and the second deflector, so that a symmetric setup is provided.

Figure 4:
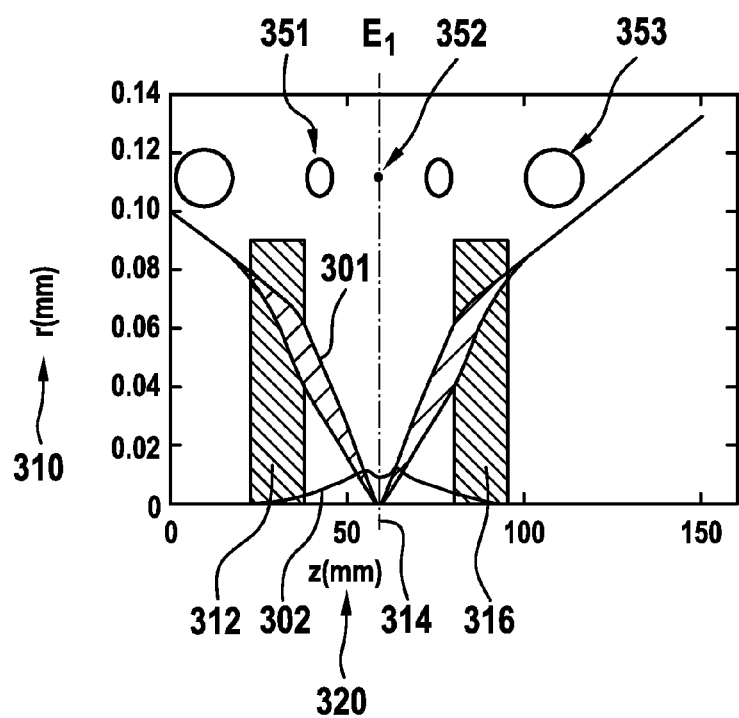
FIG. 4 is a graph showing ray tracing simulations of a charged particle beam propagating through the first deflector part shown in FIG. 3.

Ray tracing simulations have been performed to show the effect of the first deflector part 110 depicted in FIG. 3 on a charged particle beam 101. Exemplary results of the ray tracing simulations are shown in FIG. 4. Paraxial rays 301 and a dispersive axial ray 302 are illustrated. Shown is the distance (310) of the paraxial rays 301 with nominal energy from the optical axis as a function of the passed distance (320). This corresponds to an illustration of the charged particle beam in a coordinate system that is moving along the charged particle beam propagation path. The first magnetic deflection field is denoted with reference numeral 312, the position of the first electrostatic lens is denoted with reference numeral 314, and the second magnetic deflection field is denoted with reference numeral 316.

It can be seen that the initially round beam cross-section assumes an elliptic shape when passing through the first deflector (see reference numeral 351). However, due to the combination of the deflection-plane focusing by the dipole component of the first magnetic deflection field and the quadrupole components of the first magnetic deflection fields at the edge of the first deflector (tilted edge of pole piece), the charged particle beam is focused in a single point inside the electrostatic lens (see reference numeral 352). Due to the symmetry with respect to the first symmetry plane E1, the charged particle beam cross section undergoes a corresponding inverse development during the second deflection, so that the original round beam cross-sectional shape can be restored (see reference numeral 353).

The dispersive axial ray 302 (assumed to have 10 eV larger energy than the nominal particle energy of the paraxial rays 301) accumulates dispersion during the first deflection. However, the first electrostatic lens is excited in such a way that the dispersion is cancelled during the pass through the second half of the first deflector part 110. This can be either accomplished by using an accelerating lens or a decelerating lens. The effect of an accelerating lens is shown in FIG. 4.

Figure 5:
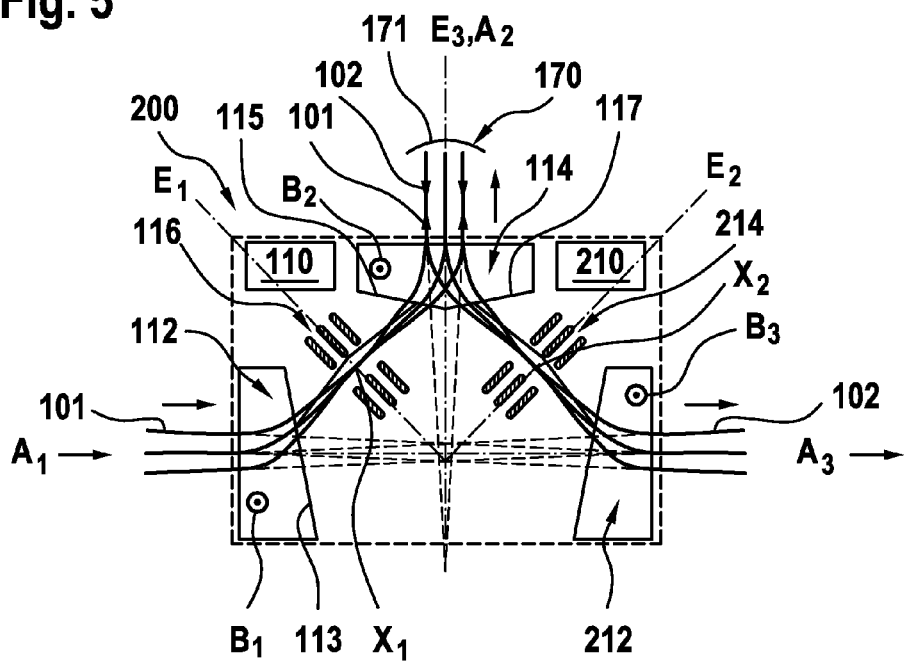
FIG. 5 shows a beam separator device according to embodiments described herein.

Next, with reference to FIG. 5, the complete setup of a beam separator device 200 including the first deflector part 110 and the second deflector part 210 will be described. The charged particle beam 101 may exit the first deflector part 110 as a stigmatic and non-dispersive beam bundle in the direction of the intermediate beam axis A2. As is shown in FIG. 5, the charged particle beam 101 propagating downstream from the second deflector 114 may be back-reflected by a reflector device 170 toward the second deflector 114 along the intermediate beam axis A2 as a reflected charged particle beam 102.

The reflector device 170 may include a mirror corrector 171 for correcting an aberration of the charged particle beam, particularly for providing compensation of spherical and/or chromatic aberrations of the charged particle beam. Such spherical and/or chromatic aberrations may be caused by (electron-) optical elements in the charged particle beam propagation path, e.g. by beam steering and/or beam shaping elements such as lens devices. In some embodiments, the mirror corrector is configured for compensating for spherical and/or chromatic aberrations introduced by a condenser lens system CLS (which may be arranged upstream from the mirror corrector 171) and/or an objective lens system (which may be arranged downstream from the mirror corrector). In other words, the mirror corrector may be configured for correcting aberrations already present in the charged particle beam entering the mirror corrector 171, and/or the mirror corrector may be configured for pre-compensating for aberrations which will be caused on the charged particle beam downstream from the mirror corrector 171. Then, an aberration-corrected charged particle beam may be focused on the specimen to be processed or examined.

After having passed through the first deflector part 110, the charged particle beam 101 may travel along the intermediate beam axis A2, which may correspond to the optical axis of the mirror corrector 171. Spatial dispersion of the charged particle beam 101 would cause different optical axes depending on the charged particle energy. Differently "colored" particles would hit different areas of the mirror corrector 171 and would collect different amounts of compensating aberrations. This would compromise the final aberration compensation in the objective lens downstream from the mirror corrector 171. However, according to embodiments described herein, a dispersion-minimized or a completely non-dispersive charged particle beam 101 may enter the mirror corrector 171. Therefore, the charged particles will also return along the optical axis of the mirror corrector 171 independent of the particle energy. In order to bring all particles of the charged particle beam exactly onto an optical axis of an objective lens system, the passage through the second deflector part 210 located downstream from the mirror corrector 171 may also be configured to be dispersion-minimized or non-dispersive.

The reflected charged particle beam 102 may re-enter the second magnetic deflection field of the second deflector 114 along the intermediate beam axis A2 and propagate through the second deflector in a reverse direction. Thus, due to the reverse propagation direction, the reflected charged particle beam 102 is deflected away from the charged particle beam 101 propagating through the second deflector 114 on the first pass. As a result, the reflected charged particle beam 102 is separated from the charged particle beam 101 propagating toward the reflector device 170. On the second pass through the second deflector 114 in the reverse direction, the reflected charged particle beam 102 may be at least partially, e.g. halfway, deflected back to continue propagation in the original propagation direction.

The second deflector part 210 may essentially be a mirror image of the first deflector part 110, so that reference can be made to the above explanations pertaining to the first deflector part 110.

In particular, the second deflector 114 may deflect the reflected charged particle beam 102 by a third deflection angle α3, which my correspond to the first and second deflection angles, toward the third deflector 212 downstream from the second deflector 114. The third deflector 212 may be configured for providing the third magnetic deflection field $B_3$, e.g. a magnetic dipole field, for deflecting the reflected charged particle beam 102 by a fourth deflection angle α4, which may correspond to the third deflection angle α3. By passing through the second magnetic deflection field $B_2$ in a reverse direction and then through the third magnetic deflection field $B_3$, the reflected charged particle beam 102 may be deflected back to continue the propagation along the original propagation direction. In particular, the beam entrance axis A1 of the beam separator device 200 may correspond to the beam exit axis A3 of the beam separator device 200.

The orientation of the magnetic field lines of the first, second and third magnetic deflection fields acting on the charged particle beam with respect to the deflection plane of the beam separator device may be equal. In other words, all four deflections may be clockwise or, alternatively, all four deflections may be counterclockwise, as shown in FIG. 5 in an exemplary way.

In some embodiments, the mirror corrector 171 and the second magnetic deflection field $B_2$ may be configured to provide a focusing effect on the reflected charged particle beam 102 such that the second crossover X2 is generated at a center position of the beam propagation path between the second deflector and the third deflector.

The second deflector part 210 includes the second electrostatic lens 214 arranged at the center position between the second deflector and the third deflector for at least partially compensating for a dispersion introduced by at least one of the second deflector and the third deflector. In particular, the first electrostatic lens 116 may be configured for compensating for a dispersion caused by the first deflector and the second deflector, when the charged particle beam 101 passes through the first deflector part 110. The second electrostatic lens 214 may be configured for compensating for a dispersion caused by the second deflector and the third deflector, when the reflected charged particle beam 102 passes through the second deflector part 210. In this case, a dispersion-free charged particle beam can be provided both at the position of the mirror corrector 171, and a dispersion-free reflected charged particle beam can be provided at a position downstream from the third deflector 212, particularly at a position of an objective lens system.

The second deflector 114 may be shaped for reducing astigmatism of the reflected charged particle beam 102. A stigmatic second crossover X2 of the reflected charged particle beam 102 downstream from the second deflector 114 may be provided, when the second deflector 114 is configured symmetric with respect to the third symmetry plane E3 centrally intersecting between the first deflector 112 and the third deflector 212. The beam separator device 200 may be configured both for providing a stigmatic first crossover X1 between the first deflector and the second deflector, and for providing a stigmatic second crossover X2 between the second deflector and the third deflector. At the same time, a spatial dispersion of the reflected charged particle beam 102 caused by the second deflector and the third deflector may be reduced or cancelled, because the second electrostatic lens 214 is arranged at the position of the second crossover X2.

In order to provide for a stigmatic second crossover X2, a beam exit edge 117 of the second deflector traversed by the reflected charged particle beam 102 may be tilted with respect to a sectional plane perpendicular to the charged particle beam propagation path between the second deflector and the third deflector by the tiling angle $\epsilon$. In other words, the edges of the pole pieces of the second deflector facing towards the second symmetry plane E2 may be tilted with respect to the symmetry plane E2 by the tilting angle $\epsilon$ at least in an area which is traversed by the reflected charged particle beam 102. That tilting angle of the beam exit edge 117 of the second deflector may introduce a quadrupole field that, together with the deflecting magnetic (dipole) field may move the second crossover X2 of the reflected charged particle beam 102 into the second symmetry plane E2, where the second electrostatic lens 214 is positioned. The third deflector 212 may be shaped such that the beam propagation path within the second deflector part 210 is symmetrical with respect to a second symmetry plane E2 intersecting the second electrostatic lens 214 perpendicular to the beam propagation path.

In further respects, reference is made to the above explanations regarding the first deflector part 110, which similarly apply to the second deflector part 210. In particular, (i) the charged particle beam propagation path may be symmetrical with respect to the second symmetry plane E2 within the second deflector part 210, (ii) the cross sectional profile of the charged particle beam may be symmetrical with respect to the second symmetry plane E2 in every sectional plane perpendicular to the charged particle beam propagation path within the second deflector part 210, and/or (iii) the cross sectional energy distribution of the charged particle beam may be symmetrical with respect to the second symmetry plane E2 in every sectional plane perpendicular to the charged particle beam propagation path within the second deflector part 210. A combined charged particle beam propagation path including the charged particle beam propagation path through the first and second deflector parts may be symmetrical with respect to the third symmetry plane E3 centrally intersecting between the first deflector 112 and the third deflector 212.

As a result, the reflected charged particle beam 102 may exit the beam separator device 200 as an aberration-compensated, non-dispersive and stigmatic beam bundle.

In some embodiments, all four deflection angles are 45°, and the magnetic deflection fields have the same orientation with respect to the optical axis, so that the charged particle beam may exit the third magnetic deflection field along the original propagation direction (straight vision system). In this case, when switching off the magnetic deflection fields, the charged particle beam may exit the beam separator device 200 without any deflection, while further propagating along the beam entrance axis A1, as is indicated in FIG. 5. When switching on the magnetic deflection fields $B_1$, $B_2$, and $B_3$, the charged particle beam may likewise exit the beam separator device, while further propagating along the beam entrance axis A1, but having been deflected away from and back toward the beam entrance axis A1, and as an aberration-corrected charged particle beam. Therefore, the beam separator device 200 shown in FIG. 5 may also be referred to as a beam switch.

Figure 6:
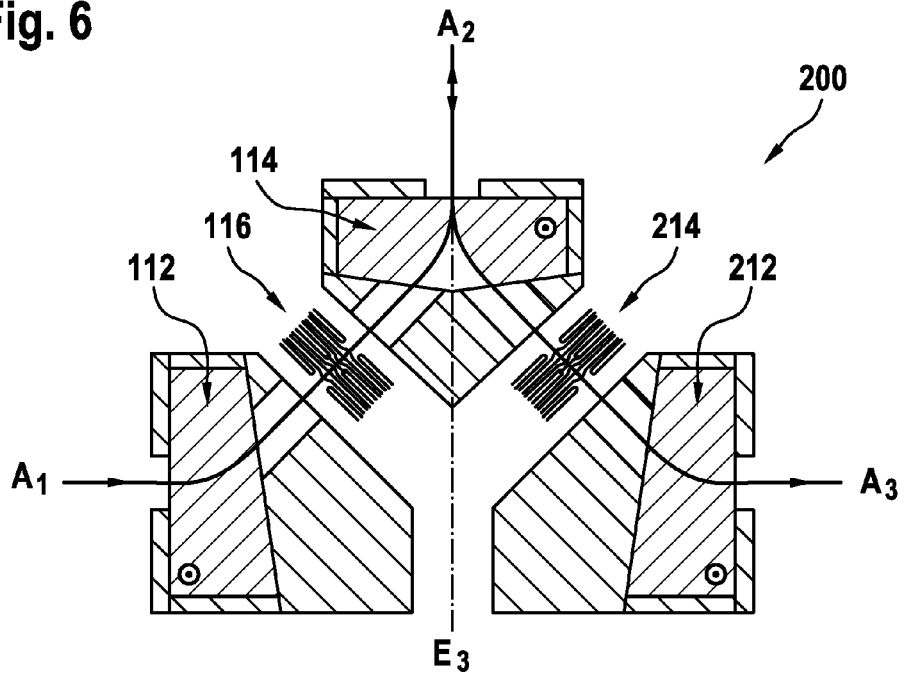
FIG. 6 shows a beam separator device according to embodiments described herein.

FIG. 6 shows a beam separator device 200 according to embodiments described herein. The beam separator device 200 includes a first deflector 112, a second deflector 114, and a third deflector 212, which are arranged and configured symmetrically with respect to the third symmetry plane E3, which centrally intersects between the first deflector and the third deflector. The first deflector 112 and the third deflector 212 include essentially trapezoidal pole piece pairs for providing the respective magnetic deflection fields, e.g. magnetic dipole fields. The pole piece pair of the second deflector 114 is configured symmetrical with respect to the third symmetry plane E3 which centrally intersects through the second deflector 114. The third symmetry plane E3 divides the second deflector into two trapezoidal pole piece sections. The first electrostatic lens 116 is arranged in the middle between the first deflector and the second deflector, and the second electrostatic lens 214 is arranged in the middle between the second deflector and the third deflector.

Figure 7:
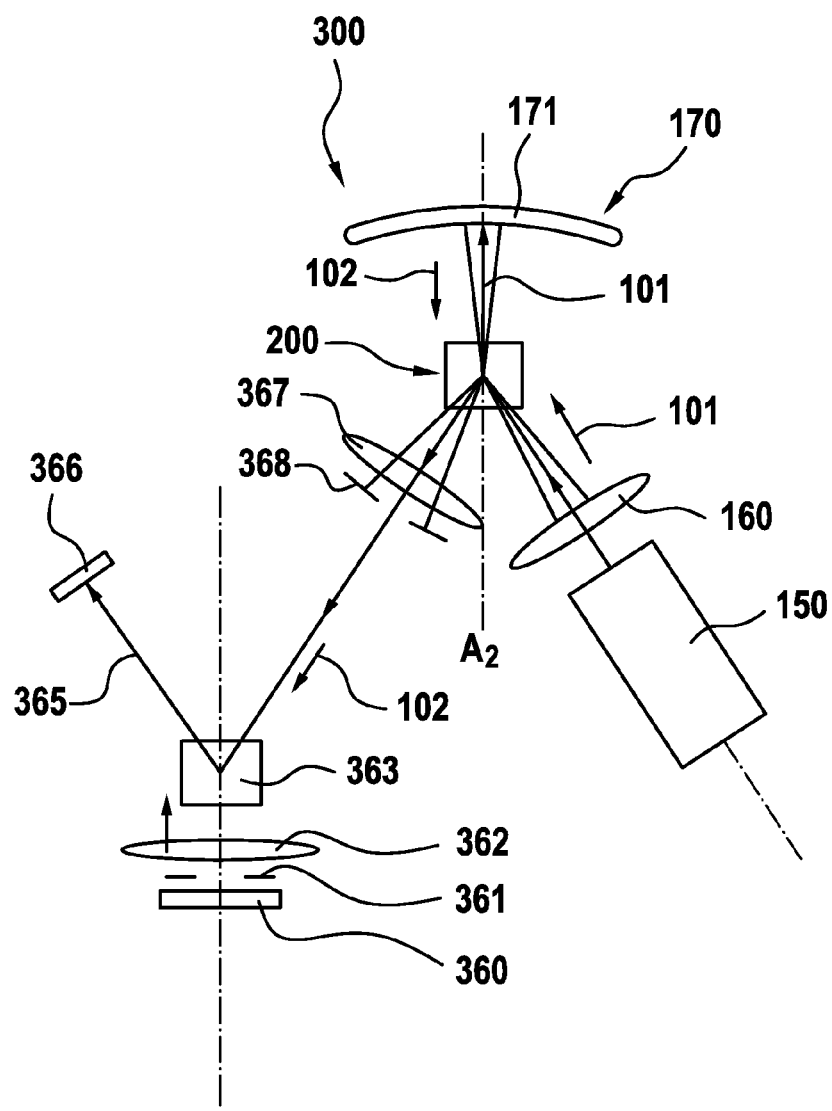
FIG. 7 shows a charged particle beam device according to embodiments described herein.

FIG. 7 shows a charged particle beam device 300 according to an embodiment in a schematic view. The charged particle beam device 300 includes a beam source 150 for generating a charged particle beam 101, and a lens device 160 for collimating or focusing the charged particle beam 101 toward a beam separator device 200.

Via the beam separator device 200, which may be a beam separator device according to any of the above described embodiments, the charged particle beam is deflected towards a mirror corrector 171 on the first pass through the beam separator device 200. The mirror corrector 171 reflects the charged particle beam 101 as a reflected charged particle beam 102 back to the beam separator device 200 along an intermediate beam axis.

On the second pass through the beam separator device 200, the reflected charged particle beam 102 is separated from the incoming charged particle beam 101 and deflected with respect to the intermediate beam axis in the direction of a beam exit axis.

The mirror corrector 171 may be adapted for correcting spherical and/or chromatic aberrations caused by optical elements in the charged beam propagation path between the beam source 150 and a specimen 360 to be investigated. These optical elements can include at least one lens device 160, a transfer lens 367, an objective lens system 362 and a control electrode 361, as shown in FIG. 7 in an exemplary way.

According to embodiments which can be combined with other embodiments described herein, an exit aperture 368 for the transfer lens 367 can be provided. The exit aperture 368 can be designed such that an opening angle of the reflected charged particle beam 102 toward a second beam separator device 363 can be defined. The beam propagation path can be flexibly adjusted in a simple manner.

According to further embodiments which can be combined with other embodiments described herein, the second beam separator device 363 can be selected from the group consisting of a magnetic deflection beam separator, a combined crossed electrostatic-magnetic field beam separator, a combination of two, three or four magnetic deflectors, a combination of a magnetic and an electrostatic deflector, a Wien filter, a dispersion free combined magnetic-electrostatic deflection unit, and any combinations thereof. In some implementations, the second beam separator device 363 may include a beam separator device according to embodiments described herein.

The control electrode 361 can be arranged within the charged particle beam propagation path between the objective lens system 362 and the specimen 360. The control electrode 361 can be adapted for adjusting, inter alia, the electrical field strength at the specimen 360 and hence the extraction of secondary particles from the surface. The landing energy at which the charged particles of the charged particle beam impinge on the specimen 360 is defined by the voltage difference between the beam source 150 and the specimen 360.

The reflected charged particle beam 102 which is reflected by the mirror corrector 171 and which already contains the aberration compensation information is used as the primary beam of charged particles for probing the specimen 360. When probing the specimen 360 using the charged particle beam, for instance in the case of an SEM column, the primary particles generate secondary particles like secondary electrons SE and/or backscattered electrons that can be used to image and analyze the specimen 360. For analyzing the specimen 360, a secondary charged particle beam 365 originating from the specimen 360 is separated from the compensated charged particle beam 102 via the second beam separator device 363 and is directed toward a detection device 366. In the case of scanning electron microscopy SEM, secondary electrons SE and/or backscattered electrons emitted from the specimen 360 can pass through the objective lens system 362 and can then be detected by the detection device 366.

The charged particle beam device 300 shown in FIG. 7 may be operated as follows in order to provide an aberration corrected charged particle beam to be used for investigating the specimen 360. A charged particle beam 101 is generated. The charged particle beam 101 is deflected with a first magnetic deflection field, particularly a magnetic dipole field, by a first deflection angle, and the charged particle beam is deflected with a second magnetic deflection field, particularly a magnetic dipole field, by a second deflection angle. A reflector device 170 is excited to reflect the charged particle beam back towards the second magnetic deflection field, which deflects the reflected charged particle beam by a third deflection angle. The charged particle beam may then be deflected with a third magnetic deflection field by a fourth deflection angle. Then, at least one of a first electrostatic lens arranged in the charged particle beam propagation path between the first magnetic deflection field and the second magnetic deflection field and a second electrostatic lens arranged in the charged particle beam propagation path between the second magnetic deflection field and the third magnetic deflection field may be excited to compensate for a spatial dispersion of the charged particle beam.

As is shown in FIG. 7, the charged particle beam may be guided to further beam steering elements and/or beam shaping elements, e.g. through an objective lens system 362. Then, a mirror corrector 171 of the reflector device 170 may be excited to at least partially compensate for spherical and/or chromatic aberrations caused by at least one beam steering element and/or beam shaping element in the charged beam propagation path, e.g. the objective lens 362 or a condenser lens system.

Figure 8:
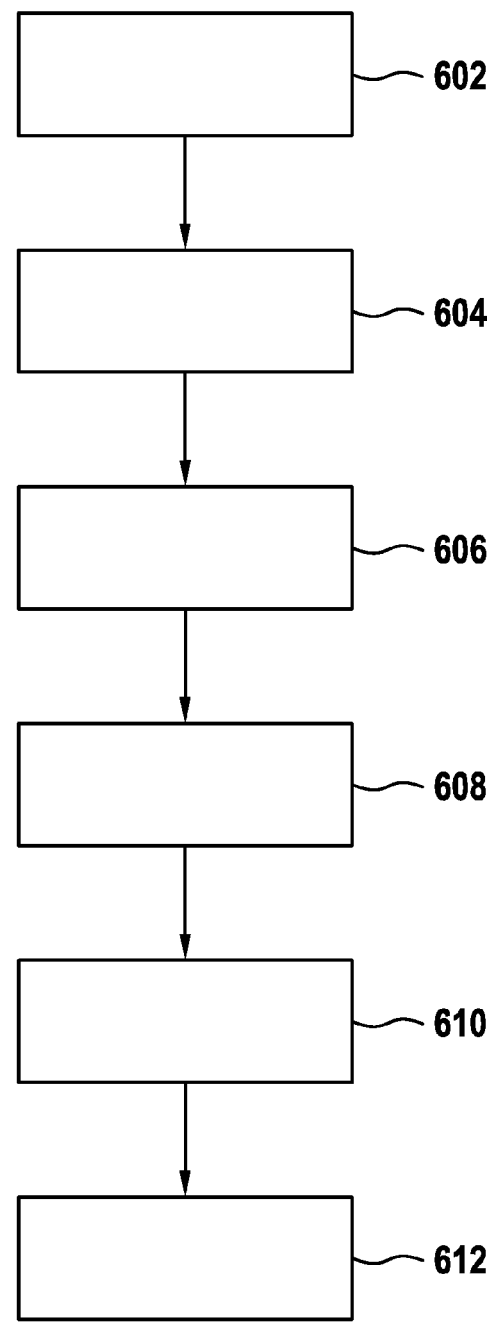
FIG. 8 shows a flowchart of a method of aligning a beam separator device according to embodiments described herein.

FIG. 8 shows a flowchart of a method of aligning a beam separator device according to embodiments described herein. In box 602, a charged particle beam, e.g. an electron beam, is generated. In box 604, the charged particle beam is deflected with a first magnetic deflection field by a first deflection angle. The charged particle beam may be focused to generate a first crossover X1 between the first magnetic deflection field and the second magnetic deflection field. Focusing can be achieved via a lens device, e.g. a condenser lens system, arranged upstream from the first magnetic deflection field and/or via the first magnetic deflection field itself, which may have a focusing effect on the charged particle beam. Then, in box 606, the charged particle beam is deflected with the second magnetic deflection field by a second deflection angle. In box 608, a reflector device is excited for back-reflecting the charged particle beam toward the second magnetic deflection field, wherein the second magnetic deflection field deflects the reflected charged particle beam by a third deflection angle. Afterward, in box 610, the charged particle beam is deflected with a third magnetic deflection field by a fourth deflection angle. Finally, in box 612, at least one of a first rotation-free lens, particularly a first electrostatic lens, arranged in the charged particle beam propagation path between the first magnetic deflection field and the second magnetic deflection field and a second rotation-free lens, particularly a second electrostatic lens, arranged in the charged particle beam propagation path between the second magnetic deflection field and the third magnetic deflection field may be excited to compensate for a dispersion of the charged particle beam.

Before exciting the first electrostatic lens, the charged particle beam, the first magnetic deflection field, and/or the second magnetic deflection field may be aligned to (i) shift the first crossover X1 of the charged particle beam to a center position between the first magnetic deflection field and the second magnetic deflection field and (ii) to reduce or eliminate astigmatism of the charged particle beam. After alignment, a cross-sectional shape of the charged particle beam downstream from the second magnetic deflection field should correspond to a cross-sectional shape of the charged particle beam upstream from the first magnetic deflection field, e.g. a round shape. Then, the electric field of the first electrostatic lens may be adjusted to reduce or eliminate a spatial dispersion of the charged particle beam, which may be caused by the first magnetic deflection field and the second magnetic deflection field.

Before exciting the second electrostatic lens, the charged particle beam may be aligned to (i) shift the second crossover X2 of the charged particle beam to a center position between the second magnetic deflection field and the third magnetic deflection field and (ii) to reduce or eliminate an astigmatism of the charged particle beam. After alignment, a cross-sectional shape of the charged particle beam downstream from the third magnetic deflection field should correspond to a cross-sectional shape of the charged particle beam upstream from the first magnetic deflection field, e.g. a round shape. Then, the electric field of the second electrostatic lens may be adjusted to reduce or eliminate a spatial dispersion of the charged particle beam, which may be caused by the second magnetic deflection field and the third magnetic deflection field.

In some embodiments, the method according to embodiments disclosed herein further includes guiding the charged particle beam through at least one beam steering element and/or beam shaping element; and exciting a mirror corrector of the reflector device to at least partially compensate for spherical and/or chromatic aberrations caused by the at least one beam steering element and/or beam shaping element.

The dispersion-free beam separator device according to embodiments herein is particularly beneficial for the following reasons:

- The crossovers X1 and X2 are placed inside an electrostatic lens, respectively, which makes alignment easy, because an excitation of the electrostatic lenses does not affect the alignment of other beam shaping optics. The only function of the electrostatic lens may be to cancel the dispersion of the beam separator device.
- Allowing for a tilted edge of the pole pieces of the deflectors may mitigate the need for additional current or voltage sources that would otherwise be necessary to excite further magnetic or electric fields for astigmatism reduction.
- Particularly when used in an SEM device, two dispersion-free deflector parts with a deflection angle of 90°, respectively, may be combined to provide a straight-vision beam system.

While the foregoing is directed to embodiments of the invention, other and further embodiments of the invention may be devised without departing from the basic scope thereof, and the scope thereof is determined by the claims that follow.

The invention claimed is:

1. A beam separator device, comprising:
 a first deflector (112) providing a first magnetic deflection field ($B_1$) for deflecting a charged particle beam propagating along a beam entrance axis (A1) by a first deflection angle ($\alpha 1$);
 a second deflector arranged downstream from the first deflector providing a second magnetic deflection field ($B_2$) for deflecting the charged particle beam by a second deflection angle ($\alpha 2$) in the direction of an intermediate beam axis (A2), wherein the second deflector is configured for deflecting the charged particle beam re-entering the beam separator device along the intermediate beam axis (A2) by a third deflection angle ($\alpha 3$);
 a third deflector arranged downstream from the second deflector providing a third magnetic deflection field ($B_2$) for deflecting the charged particle beam by a fourth deflection angle ($\alpha 4$) in the direction of a beam exit axis (A3);
 a first rotation-free lens to be arranged at a first crossover (X1) of the charged particle beam between the first deflector and the second deflector for at least partially compensating for a dispersion introduced by at least one of the first deflector and the second deflector; and
 a second rotation-free lens to be arranged at a second crossover (X2) of the charged particle beam between the second deflector and the third deflector for at least partially compensating for a dispersion introduced by at least one of the second deflector and the third deflector.

2. The beam separator device of claim 1, wherein the first rotation-free lens is a first electrostatic lens and the second rotation-free lens is a second electrostatic lens.

3. The beam separator device according to claim 1, further comprising a reflector device for reflecting the charged particle beam propagating downstream from the second deflector along the intermediate beam axis (A2) back toward the second deflector along the intermediate beam axis (A2).

4. The beam separator device according to claim 1, wherein the first deflection angle and the second deflection angle are identical, and wherein the third deflection angle and the fourth deflection angle are identical.

5. The beam separator device according to claim 1, wherein the first deflection angle, the second deflection angle, the third deflection angle, and the fourth deflection angle are identical.

6. The beam separator device according to claim 1, wherein the first, second, third, and fourth deflection angles are angles between 10° and 60°.

7. The beam separator device according to claim 1, wherein the first, second, third, and fourth deflection angles are 45°.

8. The beam separator device according to claim 1, wherein the first magnetic deflection field ($B_1$), the second magnetic deflection field ($B_2$) and the third magnetic deflection field ($B_3$) are equally oriented with respect to a deflection plane of the beam separator device.

9. The beam separator device according to claim 1, wherein the first rotation-free lens is arranged at a center position between the first deflector and the second deflector, and wherein the second rotation-free lens is arranged at a center position between the second deflector and the third deflector.

10. The beam separator device according to claim 1, wherein the first deflector and the second deflector are arranged symmetrically with respect to a first symmetry plane (E1) intersecting the first rotation-free lens, and wherein the second deflector and the third deflector are arranged symmetrically with respect to a second symmetry plane (E2) intersecting the second rotation-free lens.

11. The beam separator device according to claim 1, wherein a first part of a beam propagation path from the first deflector to the second deflector is symmetrical with respect to a first symmetry plane (E1) intersecting the first rotation-free lens, and wherein a second part of the beam propagation path from the second deflector to the third deflector is symmetrical with respect to a second symmetry plane (E2) intersecting the second rotation-free lens.

12. The beam separator device according to claim 11, wherein a combined beam propagation path comprising the first part and the second part is symmetrical with respect to a third symmetry plane (E3) centrally intersecting between the first deflector and the third deflector.

13. The beam separator device according to claim 1, wherein the first magnetic deflection field ($B_1$) is configured to provide a focusing effect on the charged particle beam such that the first crossover (X1) is located at the center position between the first deflector and the second deflector, and wherein the second magnetic deflection field ($B_2$) is configured to provide a focusing effect on the charged particle beam re-entering the second deflector such that the second crossover (X2) is located at the center position between the second deflector and the third deflector.

14. The beam separator device according to claim 1, wherein an edge of the first deflector facing the first rotation-free lens is shaped for reducing an astigmatism of the first crossover (X1), and wherein an edge of the second deflector facing the second rotation-free lens is shaped for reducing an astigmatism of the second crossover (X2).

15. A charged particle beam device, comprising:
a beam source for generating a charged particle beam;
a lens device; and
a beam separator device according to claim 1 located downstream from the lens device, wherein the lens device and the first deflector are configured to generate the first crossover (X1) of the charged particle beam at the position of the first rotation-free lens.

16. The charged particle beam device according to claim 15, further comprising a reflector device for reflecting the charged particle beam propagating downstream from the second deflector along the intermediate beam axis (A2) back toward the second deflector along the intermediate beam axis (A2).

17. The charged particle beam device according to claim 16, wherein the reflector device comprises a mirror corrector for correcting an aberration of the charged particle beam.

18. The charged particle beam device according to claim 16, further comprising an objective lens system located downstream from the beam separator device and configured for focusing the charged particle beam onto a specimen, wherein the reflector device is configured for at least partially compensating for spherical and/or chromatic aberrations caused by at least one of the lens device and the objective lens system.

19. A method of aligning a beam separator device, comprising:
generating a charged particle beam;
deflecting, by a first deflector, the charged particle beam with a first magnetic deflection field ($B_1$) by a first deflection angle;
deflecting, by a second deflector arranged downstream from the first deflector, the charged particle beam with a second magnetic deflection field ($B_2$) by a second deflection angle;
exciting a reflector device for back-reflecting the charged particle beam toward the second magnetic deflection field ($B_2$), wherein the second magnetic deflection field deflects the reflected charged particle beam by a third deflection angle;
deflecting, by a third deflector arranged downstream from the second deflector, the charged particle beam with a third magnetic deflection field ($B_3$) by a fourth deflection angle; and
exciting a first rotation-free lens arranged at a position of a first crossover (X1) of the charged particle beam between the first magnetic deflection field and the second magnetic deflection field and a second rotation-free lens arranged at a position of a second crossover (X2) of the charged particle beam between the second magnetic deflection field and the third magnetic deflection field to at least partially compensate for a dispersion of the charged particle beam.

20. The method of claim 19, further comprising:
guiding the charged particle beam through at least one beam steering element and/or beam shaping element; and
exciting a mirror corrector of the reflector device to at least partially compensate for spherical and/or chromatic aberrations caused by the at least one beam steering element and/or beam shaping element.

* * * * *